(12) United States Patent
Chang et al.

(10) Patent No.: US 7,989,898 B2
(45) Date of Patent: Aug. 2, 2011

(54) METHOD FOR FABRICATING A DUAL WORKFUNCTION SEMICONDUCTOR DEVICE AND THE DEVICE MADE THEREOF

(75) Inventors: Shou-Zen Chang, Hsinchu Country (TW); HongYu Yu, Singapore (SG)

(73) Assignees: IMEC, Leuven (BE); Taiwan Semiconductor Manufacturing Company, Ltd., Hsinchu (TW)

( * ) Notice: Subject to any disclaimer, the term of this patent is extended or adjusted under 35 U.S.C. 154(b) by 178 days.

(21) Appl. No.: 12/428,054

(22) Filed: Apr. 22, 2009

(65) Prior Publication Data
US 2009/0261424 A1    Oct. 22, 2009

Related U.S. Application Data

(60) Provisional application No. 61/047,054, filed on Apr. 22, 2008.

(30) Foreign Application Priority Data

Jul. 11, 2008   (EP) .................................... 08075619

(51) Int. Cl.
 *H01L 27/088* (2006.01)
(52) U.S. Cl. ................................ 257/392; 257/E29.137
(58) Field of Classification Search .................. 257/369, 257/371, 374, 412, 413, 407, 411, E27.062, 257/E27.067, E29.128, E29.127, E29.134
See application file for complete search history.

(56) References Cited

U.S. PATENT DOCUMENTS

| | | | |
|---|---|---|---|
| 2006/0065939 A1* | 3/2006 | Doczy et al. | 257/412 |
| 2006/0166425 A1 | 7/2006 | Triyoso | |
| 2007/0034966 A1 | 2/2007 | Kim | |
| 2007/0069311 A1 | 3/2007 | Adetutu | |
| 2007/0138563 A1* | 6/2007 | Callegari et al. | 257/369 |
| 2007/0178634 A1* | 8/2007 | Jung et al. | 438/199 |
| 2008/0099851 A1* | 5/2008 | Hsu et al. | 257/369 |
| 2009/0108294 A1* | 4/2009 | Choi et al. | 257/190 |

OTHER PUBLICATIONS

European Search Report dated Dec. 10, 2009 for EP Application No. 08075619.
Jung et al., Integration Friendly Dual Metal Gate Technology Using Dual Thickness Metal Inserted Poly-Si Stacks (DT-MIPS), 2007 IEEE Symposium on VLSI Technology, Jun. 1, 2007, pp. 196-197.

* cited by examiner

*Primary Examiner* — Minh-Loan T Tran
*Assistant Examiner* — Vongsavanh Sengdara
(74) *Attorney, Agent, or Firm* — Knobbe Martens Olson & Bear LLP (57) ABSTRACT

A dual workfunction semiconductor device and a device made thereof is disclosed. In one aspect, the device includes a first gate stack in a first region and a second gate stack in a second region. The first gate stack has a first effective workfunction, and the second gate stack has a second effective workfunction different from the first effective workfunction. The first gate stack includes a first gate dielectric capping layer, a gate dielectric host layer, a first metal gate electrode layer, a barrier metal gate electrode, a second gate dielectric capping layer, and a second metal gate electrode. The second gate stack includes a gate dielectric host layer, a first metal gate electrode, a second gate dielectric capping layer, and a second metal gate electrode.

9 Claims, 4 Drawing Sheets

METHOD FOR FABRICATING A DUAL WORKFUNCTION SEMICONDUCTOR DEVICE AND THE DEVICE MADE THEREOF

CROSS REFERENCE TO RELATED APPLICATIONS

This application claims priority under 35 U.S.C. §119(e) to U.S. provisional patent application 61/047,054 filed on Apr. 22, 2008, which application is hereby incorporated by reference in its entirety.

BACKGROUND OF THE INVENTION

1. Field of the Invention

The present invention generally relates to methods for manufacturing semiconductor devices. More particularly, this invention relates to methods for manufacturing CMOS devices having a gate stack comprising a metal gate electrode and the CMOS devices made thereof.

2. Description of the Related Technology

Up to now, semiconductor industry remains driven by scaling geometric dimensions of metal-oxide-semiconductor field-effect-transistors (MOSFETs). With traditional MOSFET-technology, using silicon dioxide (SiO2) as gate dielectric and polycrystalline silicon (poly-Si) as gate material, a lot of problems occur when scaling down to 100 nm or below.

As the gate dielectric thickness is reduced, an exponential increase of gate direct tunnelling currents occurs. One solution to solve this problem for a 45 nm technology node and beyond is the introduction of so-called high-k dielectrics as gate dielectric. A high-k dielectric is a dielectric featuring a dielectric constant (k) higher than the dielectric constant of SiO2, i.e. k>3.9. High-k dielectrics allow for a larger physical thickness (compared to SiO2) for obtaining a same effective capacitance than can be obtained with a much thinner SiO2 layer. The larger physical thickness of the high-k material will reduce gate leakage currents.

For SiO2 oxide thicknesses below 2 nm, a polysilicon (poly-Si) depletion effect starts to become dominant in the poly-Si gate. A solution to this problem is the introduction of metals as gate material. Advantages of metal gates are elimination of the polysilicon depletion effect, very low resistance, no dopant penetration possible and better compatibility with high-k gate dielectrics.

By introducing metal gates, the threshold voltage of the MOSFET becomes controlled by the metal workfunction. Regarding metal gate electrodes, tuning of the workfunction is not straightforward as a different workfunction is needed for NMOS than for PMOS. This requires now a (n-type) metal (replacing poly-Si) that works for nMOSFET (i.e. a workfunction preferably between about 3.9 eV and about 4.2 eV) and a (p-type) metal that works for pMOSFET (i.e. a workfunction preferably between about 4.9 eV and about 5.2 eV). Whereas the workfunction of a polysilicon gate electrode can be tuned by ion implantation, the workfunction of a metal gate electrode is a material property which cannot be changed easily.

The introduction of new gate materials, such as high-k gate dielectrics combined with metal gate electrodes, is not simple, since problems may occur in the traditional gate-first fabrication process steps like etch and strip. Hence, for the integration of high-k gate dielectrics and metal gate electrodes in a complementary metal-oxide-semiconductor (CMOS) device, new alternatives have to be introduced in the process flow. Although already some possibilities are available in the state-of-the-art for the integration of metal gate and high-k dielectric in CMOS devices, there is a need for simplified integration schemes for high-k/metal semiconductor device and more specific for simplified dual metal, dual dielectric (DMDD) integration schemes.

SUMMARY OF CERTAIN INVENTIVE ASPECTS

One inventive aspect relates to a dual workfunction semiconductor device comprising a semiconductor substrate, a first transistor in a first region of the semiconductor substrate, the first transistor comprising a first gate stack and a second transistor in a second region of the semiconductor substrate, the second transistor comprising a second gate stack, the first gate stack having a first effective workfunction, the second gate stack having a second effective workfunction, the second effective workfunction being different from the first effective workfunction; wherein the first gate stack comprises a second metal gate electrode overlying a second gate dielectric capping layer, the second gate dielectric capping layer overlying a barrier metal gate electrode, the barrier metal gate electrode overlying a first metal gate electrode layer, the first metal gate electrode layer overlying the gate dielectric host layer, the gate dielectric host layer overlying a first gate dielectric capping layer, the first gate dielectric capping layer overlying the semiconductor substrate in the first region and wherein the second gate stack comprises a second metal gate electrode overlying a second gate dielectric capping layer, the second gate dielectric capping layer overlying the first metal gate electrode, the first metal gate electrode overlying the gate dielectric host layer, the gate dielectric host layer overlying the semiconductor substrate in the second region and wherein the second metal gate electrode layer of the first and the second gate stack consists of the same metal composition as the first metal gate electrode layer of the first and the second gate stack.

According to an embodiment of the first aspect of the present invention the first metal gate electrode layer, the barrier metal gate electrode layer and the first gate dielectric capping layer of the first gate stack are selected to tune the first effective workfunction of the first gate stack.

According to another embodiment of the first aspect of the present invention the first metal gate electrode layer, the second gate electrode layer and the second gate dielectric capping layer of the second gate stack are selected to tune the second effective workfunction of the second gate stack.

According to another embodiment of the first aspect of the present invention the first effective workfunction is larger than the second effective workfunction. Preferably the first effective workfunction of the first gate stack is in the range of about 4.9 eV to 5.5 eV. The second effective workfunction of the second gate stack is preferably in the range of about 3.9 eV to 4.5 eV. The first transistor is preferably a PMOS transistor. The second transistor is preferably a NMOS transistor.

According to another embodiment of the first aspect of the present invention the first gate dielectric capping layer is an Al-based dielectric. More specifically the first gate dielectric capping layer is selected from the group consisting of AlO, AlN, AlON and mixtures thereof.

According to another embodiment of the first aspect of the present invention the second gate dielectric capping layer is a lanthanide-based dielectric. More specifically the second dielectric capping layer is selected from the group consisting of DyO, LaO GdO, ErO and mixtures thereof.

According to another embodiment of the first aspect of the present invention the barrier metal electrode layer comprises TiN. Alternatively, the barrier metal electrode layer may comprise TaN.

According to another embodiment of the first aspect of the present invention the first metal gate electrode layer and the second metal gate electrode layer comprise a material selected from a group consisting of $Ta_xC_y$, with x and y real numbers 0<x, y<1.

According to another embodiment of the first aspect of the present invention the first metal gate electrode layer and the second metal gate electrode layer comprise $Ta_xC_yN_zO_w$, with x,y,z,w real numbers and 0<x,y,z,w<1.

According to another embodiment of the first aspect of the present invention the gate dielectric host layer is selected from the group consisting of $SiO_2$, SiON, $HfO_2$, $ZrO_2$ and mixtures thereof.

According to one embodiment of the first aspect the first dielectric capping layer is selected from the group consisting of AlO, AlN, AlON and mixtures thereof, the second dielectric capping layer is selected from the group consisting of DyO, LaO, GdO, ErO and mixtures thereof, the first metal gate electrode layer and the second metal gate electrode layer comprise a material selected from a group consisting of TaxCy, with x and y real numbers 0<x,y<1 and the barrier metal electrode layer comprises TiN.

A second inventive aspect of the present invention relates to a method of forming a dual workfunction semiconductor device, the method comprising providing a semiconductor substrate with a first region and a second region, forming a first gate stack in the first region, the first gate stack having a first effective workfunction and a second gate stack in the second region, the second gate stack having a second effective workfunction, the second effective workfunction being different from the first effective workfunction, comprising forming a first gate dielectric capping layer in the first region, forming a gate dielectric layer in the first region and in the second region, the gate dielectric layer overlying the first gate dielectric capping layer in the first region, forming a first metal gate electrode material in the first region and in the second region, the first metal gate electrode material overlying the gate dielectric layer, forming a barrier metal gate electrode layer in the first region, the barrier metal gate electrode layer overlying the first metal gate electrode layer, forming a second gate dielectric capping layer in the second region, the second gate dielectric capping layer overlying the first metal gate electrode layer, forming a second metal gate electrode layer in the first region and in the second region, the second metal gate electrode layer overlying the second gate dielectric capping layer, wherein the second metal gate electrode layer from the first gate stack and from the second gate stack consists of the same metal composition as the first metal gate electrode layer from the first gate stack and from the second gate stack.

According to an embodiment of the second aspect of the present invention the method further comprises patterning the second metal gate electrode layer, the second gate dielectric capping layer, the barrier metal gate electrode layer, the gate dielectric host layer and the first gate dielectric capping layer to form the first gate stack and patterning the second metal gate electrode layer, the second gate dielectric capping layer, the first metal gate electrode layer and the gate dielectric host layer to form the second gate stack According to another embodiment of the second aspect of the present invention the first metal gate electrode layer, the barrier metal gate electrode layer and the first gate dielectric capping layer are selected to tune the first effective workfunction of the first gate stack.

According to another embodiment of the second aspect of the present invention the first metal gate electrode layer, the second metal gate electrode layer and the second gate dielec-tric capping layer are selected to tune the second effective workfunction of the second gate stack.

According to another embodiment of the second aspect of the present invention the first effective workfunction is larger than the second effective workfunction.

According to another embodiment of the second aspect of the present invention the first effective workfunction is in the range of about 4.9 eV to 5.5 eV.

According to another embodiment of the second aspect of the present invention the second effective workfunction is in the range of about 3.9 eV to 4.5 eV.

According to another embodiment of the second aspect of the present invention the first metal gate electrode layer, the barrier metal gate electrode layer and the first gate dielectric capping layer are selected to tune the first effective workfunction of the first gate stack towards PMOS effective workfunction.

According to another embodiment of the second aspect of the present invention the first metal gate electrode layer and the second gate dielectric capping layer are selected to tune the second effective workfunction of the second gate stack towards NMOS effective workfunction.

According to another embodiment of the second aspect of the present invention the first gate dielectric capping layer is an Al-based dielectric. More preferably the first gate dielectric capping layer is selected from the group consisting of AlO, AlN, AlON and mixtures thereof.

According to another embodiment of the second aspect of the present invention the second gate dielectric capping layer is a lanthanide-based dielectric. More preferably the second gate dielectric capping layer is selected from the group consisting of DyO, LaO GdO, ErO and mixtures thereof.

According to another embodiment of the second aspect of the present invention the barrier metal electrode layer comprises TiN or TaN.

According to another embodiment of the second aspect of the present invention the first metal gate electrode layer and the second metal gate electrode layer comprise a material selected from a group consisting of $Ta_xC_y$, with x and y real numbers 0<x, y<1.

According to another embodiment of the second aspect of the present invention the first metal gate electrode layer and the second metal gate electrode layer comprise $Ta_xC_yN_zO_w$, with x,y,z,w real numbers and 0<x,y,z,w<1.

According to another embodiment of the second aspect of the present invention the gate dielectric host layer is selected from the group consisting of $SiO_2$, SiON, $HfO_2$, $ZrO_2$ and mixtures thereof.

BRIEF DESCRIPTION OF THE FIGURES

All drawings are intended to illustrate some aspects and embodiments of the present invention. The drawings described are only schematic and are non-limiting. In the drawings, the size of some of the elements may be exaggerated and not drawn on scale for illustrative purposes.

Exemplary embodiments are illustrated in referenced figures of the drawings. It is intended that the embodiments and figures disclosed herein be considered illustrative rather than restrictive. In the different figures, the same reference signs refer to the same or analogous elements.

DETAILED DESCRIPTION OF CERTAIN ILLUSTRATIVE EMBODIMENTS

One or more embodiments of the present invention will now be described in detail with reference to the attached figures; the invention is not limited thereto. The drawings described are only schematic and are non-limiting. In the drawings, the size of some of the elements may be exaggerated and not drawn on scale for illustrative purposes. The dimensions and the relative dimensions do not necessarily correspond to actual reductions to practice of the invention. Those skilled in the art can recognize numerous variations and modifications of this invention that are encompassed by its scope. Accordingly, the description of certain embodiments should not be deemed to limit the scope of the present invention.

Furthermore, the terms first, second and the like in the description are used for distinguishing between similar elements and not necessarily for describing a sequential or chronological order. It is to be understood that the terms so used are interchangeable under appropriate circumstances and that the embodiments of the invention described herein are capable of operation in other sequences than described or illustrated herein.

Moreover, the terms top, bottom, over, under and the like in the description are used for descriptive purposes and not necessarily for describing relative positions. The terms so used are interchangeable under appropriate circumstances and the embodiments of the invention described herein can operate in other orientations than described or illustrated herein. For example "underneath" and "above" an element indicates being located at opposite sides of this element.

In the description provided herein, numerous specific details are set forth. However, it is understood that embodiments of the invention may be practiced without these specific details. In other instances, well-known methods, structures and techniques have not been shown in detail in order not to obscure an understanding of this description.

Where, herein, a specific chemical name or formula is given, the material may include non-stoichiometric variations of the stoichiometrically exact formula identified by the chemical name. Lack of numerical subscript by an element in the formula stoichiometrically signifies the number one (1). Variations in the range plus/minus 20% of the exact stoichiometric number are comprised in the chemical name or formula, for the present purposes. Where an algebraic subscript is given, then variations in the range of about plus/minus 20% are comprised relative to the value of each subscript. Such varied values do not necessarily sum to a whole number and this departure is contemplated. Such variations may occur due to either intended selection and control of the process conditions, or due to unintended process variations.

It is to be noticed that the term "comprising" should not be interpreted as being restricted to the means listed thereafter; it does not exclude other elements or processes. Thus, the scope of the expression "a device comprising means A and B" should not be limited to devices consisting only of components A and B. It means that with respect to the present description, the only relevant components of the device are A and B.

Various embodiments of the invention are referring to parameters of the semiconductor device such as threshold voltage (Vt), effective work function ($WF_{eff}$), or physical characteristics of the material(s) employed such as work function (WF), Fermi level etc. The definitions as used through this document are summarized herein below.

In the MOSFET device, the gate requires a threshold voltage (Vt) to render the channel conductive. Complementary MOS (CMOS) processes fabricate both n-channel and p-channel (respectively NMOS and PMOS) transistors. The difference of the threshold voltage Vt, i.e. the difference of the threshold voltage between the NMOS and PMOS transistor, is influenced by what is called the difference of the effective work function ($\Delta WF_{eff}$). The difference of the effective work function is the difference between the effective workfunction of the NMOS transistor and the effective workfunction of the PMOS transistor. To establish threshold voltage (Vt) values for the PMOS transistor and NMOS transistor respectively, the effective work function difference of the respective PMOS and NMOS gate materials (gate stacks) and their corresponding channel regions is independently established through channel processing and gate processing. In other words, both gate dielectric (comprising i.e. a host dielectric and optional different capping layers) and gate electrode (comprising at least one metal layer) determine the effective work function of the gate stack (device) ($WF_{eff}$). Moreover, the gate processing itself (i.e. the sequence of the different steps and/or the thermal treatments applied) may have an influence on the effective work function of the gate stack (device) ($WF_{eff}$).

The effective work function of a gate stack (device) ($WF_{eff}$) is a parameter that can be tuned by the choice of the gate dielectric materials, gate electrode materials and by the gate processing performed. On the contrary, the work function (WF) of the gate electrode (often referred to as metal gate electrode or metal layer electrode or metal control electrode) is an intrinsic property of the material. In general, the work function of a certain material is a measure of the energy, in electron volts (eV), required to eject an electron in the material outside of a material atom to the vacuum, if the electron were initially at the Fermi level. The work function of the gate electrode may also be referred to as as-deposited workfunction or the intrinsic workfunction of the material.

For a silicon substrate, the gate electrode of a negative channel MOSFET (or NMOS) device would have an n-type work function of approximately 4.1 eV (+/−about 0.3 eV), and the gate electrode of a positive channel MOSFET (or PMOS) device would have a p-type work function of approximately 5.2 eV (+/−about 0.3 eV).

A high-k dielectric is a dielectric featuring a dielectric constant (k) higher than the dielectric constant of SiO2, i.e. k>3.9. High-k dielectrics allow for a larger physical thickness (compared to SiO2) for obtaining a same effective capacitance than can be obtained with a much thinner SiO2 layer.

In the following certain embodiments will be described with reference to a silicon (Si) substrate but it should be understood that they apply equally well to other semiconductor substrates. In embodiments, the "substrate" may include a semiconductor substrate such as e.g. a silicon, a gallium arsenide (GaAs), a gallium arsenide phosphide (GaAsP), an indium phosphide (InP), a germanium (Ge), or a silicon germanium (SiGe) substrate. The "substrate" may include for example, an insulating layer such as a $SiO_2$ or a $Si_3N_4$ layer in addition to a semiconductor substrate portion. Thus, the term substrate also includes silicon-on-glass, silicon-on-sapphire substrates. The term "substrate" is thus used to define generally the elements for layers that underlie a layer or portions of interest. Also, the "substrate" may be any other base on which a layer is formed, for example a glass or metal layer. Accordingly a substrate may be a wafer such as a blanket wafer or may be a layer applied to another base material, e.g. an epitaxial layer grown onto a lower layer.

A first aspect of the present invention relates to a dual workfunction semiconductor device, the dual workfunction semiconductor device comprising:

a semiconductor substrate a first transistor comprising a first gate stack in a first region of the semiconductor substrate and a second transistor comprising a second gate stack in a second region of the semiconductor substrate, the first gate stack having a first effective workfunction, the second gate stack having a second effective workfunction, the second effective workfunction being different from the first effective workfunction;

wherein the first gate stack comprises a second metal gate electrode on and in contact with a second gate dielectric capping layer, the second gate dielectric capping layer on and in contact with a barrier metal gate electrode, the barrier metal gate electrode on and in contact with a first metal gate electrode layer, the first metal gate electrode layer on and in contact with a gate dielectric host layer, the gate dielectric host layer on and in contact with a first gate dielectric capping layer, the first gate dielectric capping layer on and in contact with the semiconductor substrate in the first region and wherein the second gate stack comprises the second metal gate electrode on and in contact with the second gate dielectric capping layer, the second gate dielectric capping layer on and in contact with the first metal gate electrode, the first metal gate electrode on and in contact with the gate dielectric host layer, the gate dielectric host layer on and in contact with the semiconductor substrate in the second region and wherein the second metal gate electrode layer of the first and the second gate stack consists of the same metal composition as the first metal gate electrode layer of the first and the second gate stack.

Figure 7:
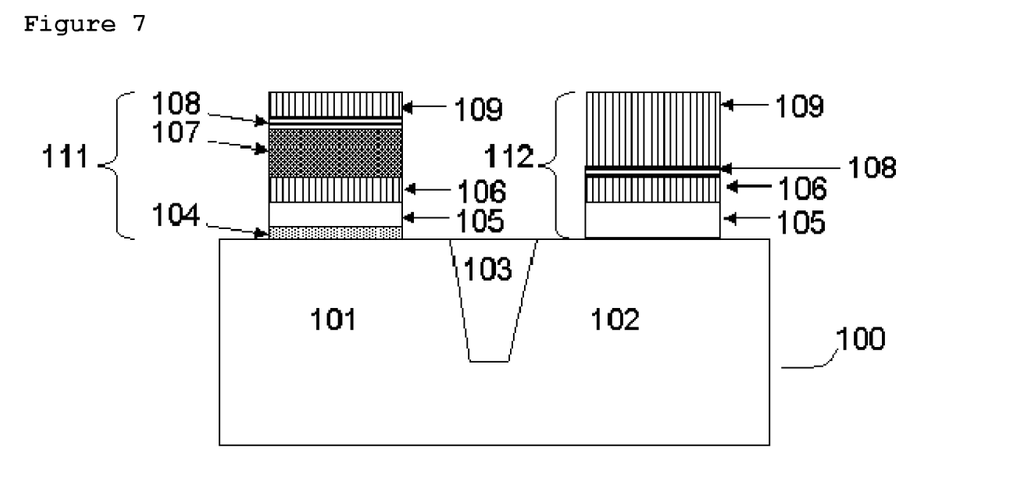
FIG. 7 represents a schematic cross-section of a dual workfunction semiconductor device according to one embodiment.

FIG. 7 shows a cross-sectional view of a dual workfunction semiconductor device according to the first aspect of the present invention.

The first metal gate electrode, the barrier metal gate electrode and the first gate dielectric capping layer are selected such that this stack of layers may tune the first effective workfunction $WF1_{eff}$ of the first gate stack 111. Optionally the gate dielectric host layer may also be selected to further tune the first effective workfunction $WF1_{eff}$ of the first gate stack 111. Preferably the first effective workfunction $WF1_{eff}$ of the first gate stack 111 is adapted towards a value in of about 5.2 eV (+/−about 0.3 eV). The first gate stack thus preferably is formed for a positive channel MOSFET (or PMOS) device. The first transistor comprises thus preferably a PMOS transistor.

The first metal gate electrode, the second metal gate electrode and the second gate dielectric capping layer are such that this stack of layers may tune the second effective workfunction $WF2_{eff}$ of the second gate stack 112. Optionally this stack of layer may include the gate dielectric host layer to also further tune the second effective workfunction $WF2_{eff}$. Preferably the second effective workfunction $WF2_{eff}$ of the second gate stack 112 is adapted towards a value of about 4.2 eV (+/−about 0.3 eV). The second gate stack thus preferably is formed for a negative channel MOSFET (or NMOS) device. The second transistor comprises thus preferably an NMOS transistor.

In one embodiment, wherein the first transistor comprises a PMOS transistor and wherein the second transistor comprises a NMOS transistor, the first gate dielectric capping layer comprises preferably a dielectric element with higher electronegativity compared to another dielectric element from the second gate dielectric capping layer. The first gate dielectric capping layer comprises preferably the dielectric element with more electronegative atoms, whereas the second gate dielectric capping layer comprises preferably the another dielectric element with more electropositive atoms. The first gate dielectric capping layer may comprise preferably an aluminum-based dielectric, i.e. AlO, AlN, AlON and mixtures thereof, whereas the second dielectric capping layer may comprise preferably a lanthanide-based dielectric, i.e. any of DyO(N), LaO(N), ScO(N), GdO(N), TbO(N), YbO(N), ErO(N) and mixtures thereof.

In an embodiment, the first and second metal gate electrode may comprise a metal layer having a p-type work function. Advantageously, the first and second metal gate electrode consists of a metal layer having a p-type work function. The first and second metal layer may comprise a Ta-, W-, Mo-based material. More advantageously, the metal gate electrode consists of $Ta_xC_yN_zO_w$, with x,y,z,w real numbers and $0<x,y,z,w<1$.

In another embodiment, the first and second metal gate electrode layer may comprise a metal layer with a n-type workfunction. Advantageously, the first and second metal gate electrode consists of a metal layer having a n-type work function. The first and second metal layer may comprise a Ta-, Ti-based material. More advantageously, the first and second metal layer material is selected from a group consisting of TaxCy, with x and y real numbers and $0<x, y<1$.

In one embodiment, the gate dielectric host layer is selected from the group consisting of $SiO_2$, SiON, $HfO_2$, $ZrO_2$ and mixtures thereof. These materials present the advantage of a stable interface with the silicon substrate.

The barrier metal gate electrode comprises preferably a metal comprising material which blocks the influence of the second gate dielectric capping layer and the second metal gate electrode in the first transistor towards the first effective workfunction. The metal comprising material of the barrier metal gate electrode may be selected to tune the first effective workfunction (together with the first gate dielectric capping layer). Advantageously the barrier metal gate electrode may comprise TiN. The barrier metal gate electrode may comprise TaN.

A second aspect of the present invention relates to a method of manufacturing a dual work function semiconductor device comprising:

providing a semiconductor substrate with a first region and a second region, forming a first transistor, the first transistor comprising a first gate stack in the first region, the first gate stack having a first effective workfunction and forming a second transistor, the second transistor comprising a second gate stack in the second region, the second gate stack having a second effective workfunction, the second effective workfunction being different from the first effective workfunction, comprising:

forming a first gate dielectric capping layer only in the first region, forming a gate dielectric host layer in the first region and in the second region, the gate dielectric host layer overlying the first gate dielectric capping layer in the first region, forming a first metal gate electrode material in the first region and in the second region, the first metal gate electrode material overlying the gate dielectric host layer, forming a barrier metal gate electrode layer only in the first region, the barrier metal gate electrode layer overlying the first metal gate electrode layer, forming a second gate dielectric capping layer in the first region and in the second region, the second gate dielectric capping layer overlying the barrier metal gate electrode layer in the first region, the second gate dielectric capping layer overlying the first metal gate electrode layer in the second region, forming a second metal gate electrode layer in the first region and in the second region, the second metal gate electrode layer overlying the second gate dielectric capping layer, the second metal gate electrode layer comprising the same metal as the first metal gate electrode layer.

With reference now to FIG. 1 to FIG. 7 different process steps for a method of manufacturing a dual workfunction semiconductor device according to the second aspect of the present invention is described in more detail.

Figure 1:
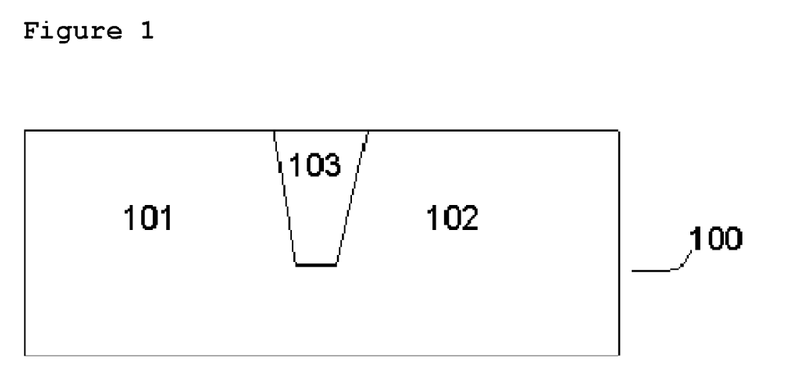
FIG. 1 to FIG. 6 represent different schematic cross-sections of a device corresponding to several process steps according to an embodiment of the present invention of a method of manufacturing a dual work function semiconductor device.

FIG. 1 illustrates a semiconductor substrate 100, e.g. a silicon substrate. The substrate 100 may comprise multiple distinct regions. Most preferably two distinct regions may be defined in the substrate 100, as is illustrated in FIG. 1: a first region 101 and a second region 102. The first region 101 may also be referred as the first active region of the device wherein a first transistor will be formed and the second region 102 may also be referred as the second active region of the device wherein a second transistor will be formed. The first region 101 and the second region 102 may be electrically isolated from each other by an insulating region 103. A possible way to isolate the first 101 and second 102 region from each other is by using shallow trench isolation (STI) in between. STI is a deep narrow trench, filled with oxide, etched into the semiconductor substrate in between adjacent devices in an integrated circuit to provide electrical isolation between. Alternatively, local oxidation of silicon (LOCOS) may be used. The first region 101 may for example represent a PMOS region and the second region 102 may for example represent a NMOS region or vice versa.

Figure 2:
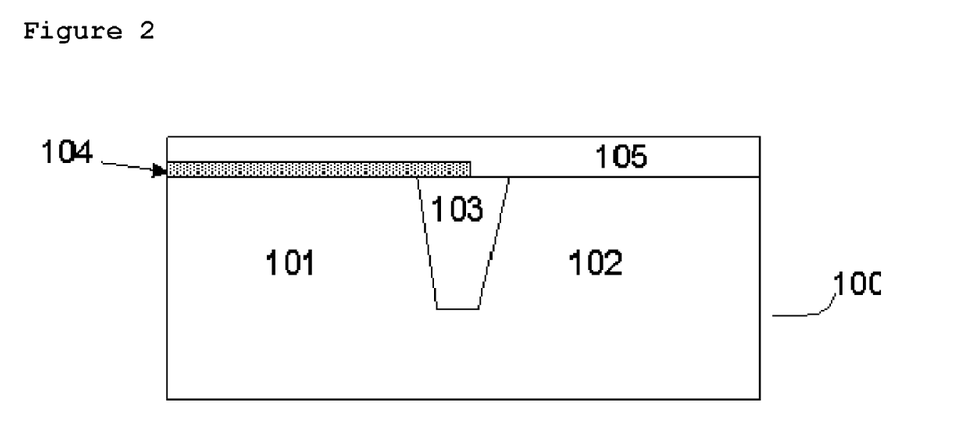

After providing the first and second region in the substrate, a first gate stack and a second gate stack are formed in the first and second active region respectively. Thereafter a first gate dielectric capping layer 104 is provided which is only present in the first region 101 (FIG. 2). Providing the first gate dielectric capping layer 104 may be provided using conventional process steps and equipment, as well known for a person skilled in the art, such as for example first depositing a gate dielectric capping layer on the substrate in both the first and the second region and subsequently patterning the gate dielectric capping layer using conventional lithography steps in order to remove part of the gate dielectric capping layer in the second region 102.

The first gate dielectric capping layer 104 material is selected to tune the first effective workfunction of the first gate stack. Further on in the integration scheme also the first/second metal gate electrode layer material is selected to further tune the first effective workfunction of the first gate stack In one embodiment, the first gate dielectric capping layer 104 may comprise an aluminum-based dielectric or a lanthanide-based dielectric. The first gate dielectric capping layer 104 may comprise LaO(N), AlO(N), AlN, DyO(N), ScO(N), GdO(N), CeO(N), TbO(N), ErO(N), YbO(N) or any combination thereof. Depending on the material of the first gate dielectric capping layer 104, this layer may be suitable for tuning the first effective workfunction toward an NMOS device or towards a PMOS device. For example DyO is know to be a dielectric with more electropositive atoms such that the built-in dipole field in the dielectric (e.g. HfSiON—DyO stack) may adapt the threshold voltage of the workfunction of the metal gate (e.g. TiN). The DyO layer will thus determine the effective workfunction, which is suitable for an NMOS transistor. For example AlO is know to be a dielectric with more electronegative atoms such that the built-in dipole field in the dielectric (e.g. HfSiON—AlO stack) may adapt the threshold voltage of the PMOS device independently of the workfunction of the metal gate (e.g. TiN). The AlO layer will thus determine the effective workfunction, which is suitable for a PMOS transistor.

The first gate dielectric capping layer 104 may preferably have an equivalent oxide thickness (EOT) in the range of about 0.2 nm to 2 nm, more preferably in the range of about 0.2 nm to 1 nm and even more preferably in the range of about 0.2 nm to 0.5 nm. This corresponds to a physical thickness of the dielectric capping layer 114 in the range of about 0.5-2 nm.

The first gate dielectric capping layer 104 is formed by using any deposition technique such as ALD, PVD, or CVD.

After providing the (first) gate dielectric capping layer 104 in the first region 101 a gate dielectric host layer 105 is provided in the first region 101 and in the second region 102, the gate dielectric host layer 105 on and in contact with the (first) gate dielectric capping layer 104 in the first region 101 and on and in contact with the substrate 100 in the second region 102 (FIG. 2).

The gate dielectric host layer 105 may be a layer of insulating material, such as for example silicon dioxide ($SiO_2$), silicon nitride (SiN) or silicon oxynitride ($Si_xO_yN_{1-x-y}$) or any high-k dielectric material (i.e. k>3.9) such as for example $HfO_2$, $TaO_x$, $Al_2O_3$, $ZrO_2$ or any combination made thereof. These materials present the advantage of a stable interface with the silicon substrate 100.

The gate dielectric host layer may be formed by thermal oxidation or chemical vapor deposition (CVD), or any other suitable method known to a person skilled in the art. The gate dielectric host layer 105 may comprise a stack of dielectric materials, such as for example a high-k material formed on top of an (optional) interfacial dielectric layer (not shown) between the substrate 100 and high-k material. The gate dielectric host material 105 has a thickness preferably in the range of about 0.5 nm to 4 nm. The thickness of the gate dielectric host layer in the second region may be higher than the thickness of the gate dielectric host layer in the first region.

Figure 3:
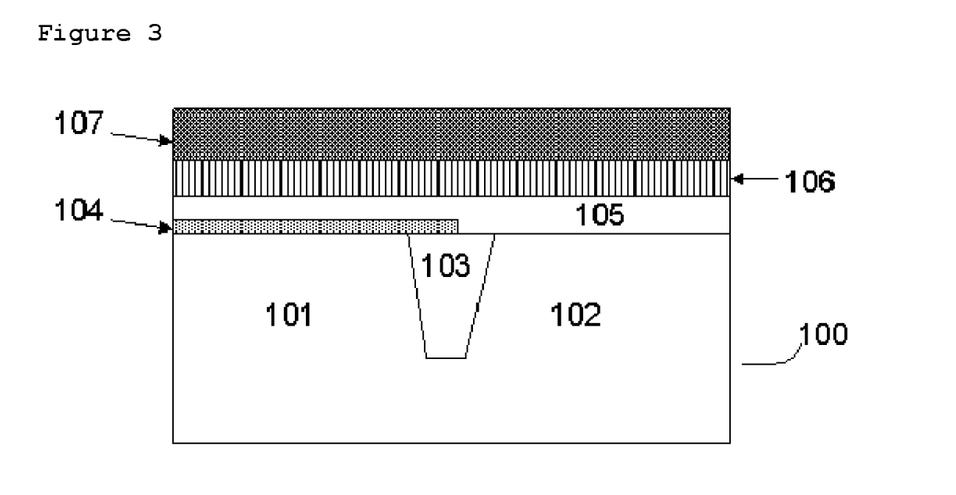

After providing the gate dielectric host material 105 a first metal gate electrode layer 106 is provided overlying (on and in contact with) the gate dielectric host material 105 and thereafter a barrier metal gate electrode layer 107 is provided on and in contact with the first metal gate electrode layer 106 (FIG. 3).

The first metal gate electrode layer 106 is formed having a first (as-deposited) workfunction. The first metal gate electrode layer 106 comprises a metal comprising material to form a metal gate. With metal comprising material is understood metals, metal alloys, metal suicides, conductive metal nitrides, conductive metal oxides, . . . . Depending on the metal, the workfunction of the first metal gate electrode layer 106 may be similar to the workfunction of a conventional p-type doped semiconductor or to the workfunction of a conventional n-type doped semiconductor. For example nickel (Ni), ruthenium oxide (RuO), and molybdenum nitride (MoN) have a workfunction similar to a p-type doped semiconductor material. For example ruthenium (Ru), zirconium (Zr), niobium (Nb), tantalum (Ta), titanium silicide ($TiSi_2$) have a workfunction similar to a n-type doped semiconductor material. For example TiN has is a midgap workfunction i.e. in between the workfunction for n-type doped and p-type doped semiconductor material (for TiN on $SiO_2$, ~4.65 eV-4.8 eV).

For example a metal gate electrode material 106 may be formed having a first (as-deposited) workfunction which is suitable for forming a NMOS gate electrode (i.e. NMOS transistor) in the first region 101, but which is not suitable for forming a PMOS gate electrode (i.e. PMOS transistor) in the second region 102. Or vice versa a metal gate electrode material 115 may be formed having a first (as-deposited) workfunction which is suitable for forming a PMOS gate electrode in the first region 101, but which is not suitable for forming a NMOS gate electrode in the second region 102. For the formation of a dual workfunction semiconductor device using one metal gate electrode material for both regions (NMOS and PMOS), the workfunction of the metal gate electrode material 106 needs to be tuned selectively, i.e. the workfunction of the metal gate electrode material 106 needs to be tuned in that region for which its first (as-deposited) workfunction is not suitable. With as-deposited workfunction is meant the intrinsic workfunction of the material.

The first gate dielectric capping layer 104 located under the first metal gate electrode material 106 in the first region 101 will induce a first workfunction shift of the as-deposited workfunction WF of the first metal gate electrode material 106.

The first metal gate electrode material 106 has a thickness in the range of about 0.5 nm to 10 nm, more preferably in the range of 5 nm to 10 nm and is deposited using a deposition technique such as for example ALD, CVD, or PVD.

After the formation of the first metal gate electrode layer 106, a barrier metal electrode layer 107 is formed on and in contact with the first metal gate electrode layer 106 (FIG. 3). The barrier metal gate electrode material 107 has a thickness in the range of about 0.5 nm to 10 nm, more preferably in the range of about 5 nm to 10 nm and is deposited using a deposition technique such as for example ALD, CVD, or PVD.

Figure 4:
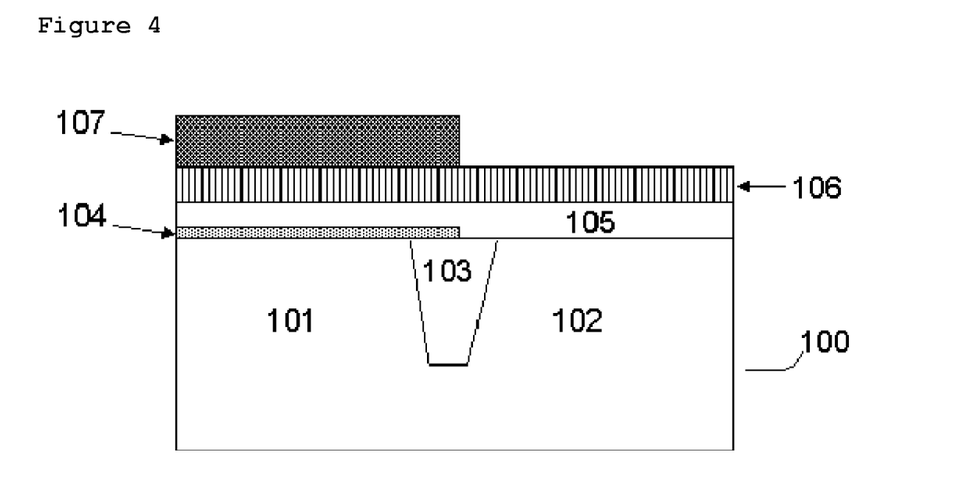

Part of the barrier metal electrode layer 107, i.e. the part in the second region, is further removed using conventional etching techniques known for a person skilled in the art (FIG. 4). The first metal gate electrode layer 106 may be used as an etch stop layer. The barrier metal gate electrode layer 107 is thus selectively etched towards the first gate metal electrode layer 106. A wet etch may be preferably used. For example if the first metal gate electrode layer comprises $Ta_2C$ and the barrier metal layer 107 comprises TiN, part of the TiN layer in the second region may be selectively removed using wet etching with high selectivity towards $Ta_2C$.

The barrier metal electrode layer 107 comprises preferably a material which may be etched selectively towards the underlying first metal gate electrode layer 106. The barrier metal gate electrode layer 107 further comprises a metal comprising material. In the first region the effective workfunction of the final first gate stack will thus be determined by the workfunction of the first metal gate electrode layer 106, by the workfunction of the barrier metal electrode layer 107 and further tuned by the first gate dielectric capping layer 104.

The barrier metal electrode layer 107 has a thickness which is thick enough to block any influence to the effective workfunction which could be induced by additional layers which are formed on top of this barrier metal electrode layer 107 in the following process steps. The thickness of the barrier metal electrode layer 107 is in the range of about 2 nm to 5 nm.

At this point in the process flow, the first gate stack comprises the barrier metal electrode layer 107 on and in contact with the first metal gate electrode layer 106 on and in contact with the gate dielectric host layer 105 on and in contact with the first dielectric capping layer 104. The second gate stack comprises the first metal gate electrode layer 106 on and in contact with the gate dielectric host layer 105 on and in contact with the first dielectric capping layer 104.

In a next process step (FIG. 5), a second gate dielectric capping layer 108 is formed in the first region 101 and the second region 102. More specifically, the second gate dielectric capping layer 108 is formed on and in contact with the first metal gate electrode layer 106 in the first region 101 and on and in contact with the barrier metal electrode layer 107 in the second region 102. Preferably a conformal second gate dielectric capping layer 108 is formed using ALD, CVD, or PVD.

Figure 5:
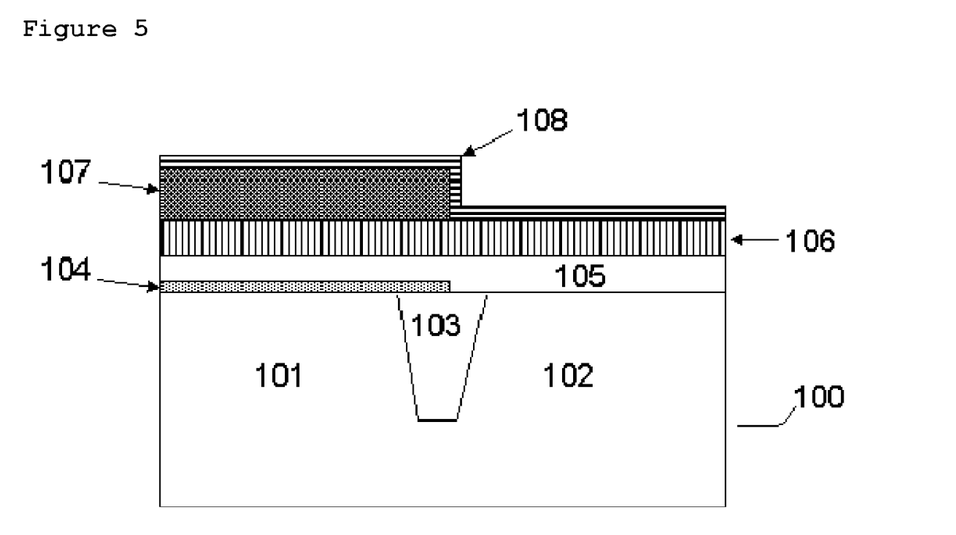

The second gate dielectric capping layer 108 may comprise LaO(N), AlO(N), AlN, DyO(N), ScO(N), GdO(N), CeO(N), TbO(N), ErO(N), YbO(N) or any combination thereof. Depending on the material of the second gate dielectric capping layer 108, this layer may be suitable for tuning the first effective workfunction toward an NMOS device or towards a PMOS device. For example DyO is know to be a dielectric with more electropositive atoms such that the built-in dipole field in the dielectric (e.g. HfSiON—DyO stack) may adapt the threshold voltage of the NMOS device independently of the workfunction of the metal gate (TiN). The DyO layer will thus determine the effective workfunction, which is suitable for an NMOS transistor. For example AlO is know to be a dielectric with more electronegative atoms such that the built-in dipole field in the dielectric (e.g. HfSiON—DyO stack) may adapt the threshold voltage of the PMOS device independently of the workfunction of the metal gate (TiN). The AlO layer will thus determine the effective workfunction, which is suitable for an PMOS transistor.

The second gate dielectric capping layer 108 may preferably have an equivalent oxide thickness (EOT) in the range of about 0.2 nm to 2 nm, more preferably in the range of about 0.2 nm to 1 nm and even more preferably in the range of about 0.2 nm to 0.5 nm. This corresponds to a physical thickness of the dielectric capping layer 114 in the range of about 0.5 nm to 2 nm.

For example, the first region (first gate stack) may comprise a first gate dielectric capping layer 104 comprising AlO. This dielectric is known to be suitable for tuning the effective workfunction of the (first) gate stack towards P-type. The second gate dielectric layer 108 in the second region (second gate stack) may then comprise LaO. This dielectric is known to be suitable for tuning the effective workfunction of the (second) gate stack toward N-type. By using AlO and LaO as first 104 and second 108 gate dielectric capping layer respectively the effective workfunction of the first and second gate stack respectively may be tuned towards PMOS and NMOS respectively using the same first metal gate electrode layer 106 comprising for example $Ta_2C$.

It is an advantage of certain embodiments of the present invention that the second gate dielectric capping layer 108, which is only for tuning the effective workfunction of the second gate stack (the second transistor) in the second region 102, may remain present in the first gate stack in the first region 101. Due to the presence of the barrier metal layer 107 the second gate dielectric capping layer 108 will not influence the effective workfunction of the first gate stack. It is an advantage of certain embodiments of the present invention that the second gate dielectric capping layer 108 does not need to be selectively etched. It is another advantage of certain embodiments of the present invention that the number of process steps to manufacture a dual workfunction semiconductor device is drastically reduced. Since the second gate dielectric capping layer does not need to be etched, the second gate dielectric capping layer may be deposited over the entire device without additional steps of patterning comprising the steps of applying a resist, lithographic exposing the resist, developing the resist and etching.

Figure 6:
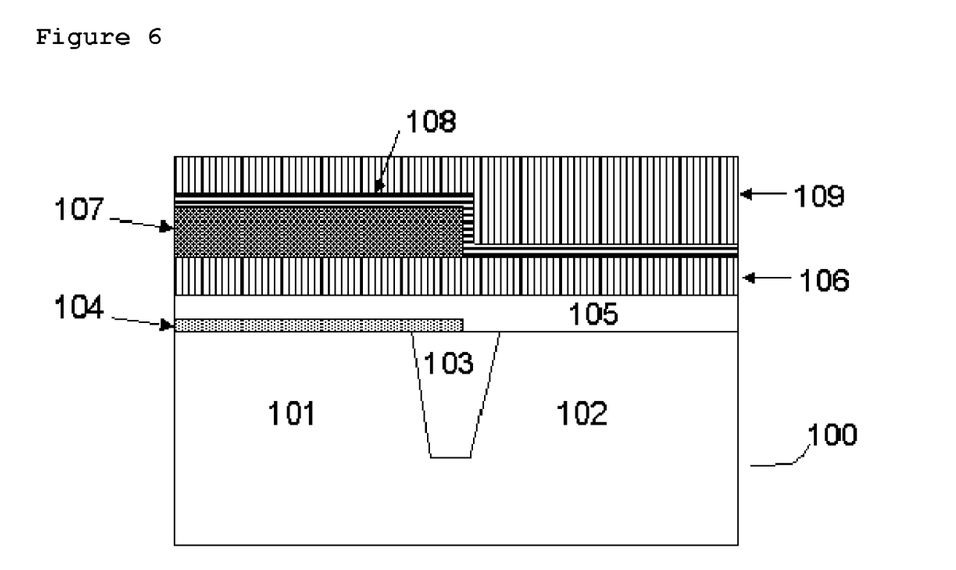

In order to have the second gate dielectric capping layer 108 suitable for tuning the effective workfunction of the second gate stack in the second region 102, in a next process step, a second metal gate electrode layer 109 is formed in the first region 101 and the second region 102, such that the second metal gates electrode layer 109 is overlying (on and in contact with) the second gate dielectric capping layer 107 (FIG. 6). The second metal gate electrode layer 109 comprises the same metal as the first metal gate electrode layer 106, more preferably consists of the same metal composition as the first metal gate electrode layer 106.

It is an advantage of certain embodiments of the present invention that one and the same metal gate electrode material is used for both the first gate stack (first transistor) and second gate stack (second transistor).

In a following process step the stack of layers is patterned using conventional techniques (lithography, etching) to form a first gate stack 111 in the first region 101 and a second gate stack 112 in the second region 102 (FIG. 7). The first gate stack 111 comprises the second metal gate electrode layer 109 on and in contact with the second gate dielectric capping layer 108 on and in contact with the barrier metal electrode layer 107 on and in contact with the first metal gate electrode layer 106 on and in contact with the gate dielectric host layer 105 on and in contact with the first dielectric capping layer 104. The second gate stack 112 comprises the second gate dielectric capping layer 108 on and in contact with the barrier metal electrode layer 107 on and in contact with the first metal gate electrode layer 106 on and in contact with the gate dielectric host layer 105 on and in contact with the first dielectric capping layer 104.

The first effective workfunction in the first gate stack 111 is determined by the combination of the barrier metal gate electrode layer 107, the first metal gate electrode layer 106 and the first gate dielectric capping layer 104. The second effective workfunction in the second gate stack 112 is determined by the combination the first metal gate electrode layer 106, the second metal gate electrode layer 109 and the second gate dielectric capping layer 108, which is sandwiched in between the first 106 and second 109 metal gate electrode layer. The first effective workfunction and the second effective workfunction are different. The first effective workfunction of the first gate stack is preferably larger than the second effective workfunction of the second gate stack. The first effective workfunction is preferably suitable for a PMOS device and the second effective workfunction is preferably suitable for a NMOS or vice versa.

The barrier metal gate electrode layer 107 prevents any influence of the second metal gate electrode layer 109 and the second gate dielectric capping layer 108 to the first effective workfunction of the first gate stack 111.

It is an advantage of certain embodiments of the present invention that the second dielectric capping layer 108 does not need to go through a selective removal step. There are no concerns regarding stripping of photoresist, host dielectric undercut at the gate edge, surface chemical attack issues.

It is a further advantage of certain embodiments of the present invention that the process steps may be kept simple and cost-effective since no selective etching towards the gate dielectric host layer is necessary.

It is another advantage of certain embodiments of the present invention that the effective workfunction of the first gate stack 111 may be influenced towards an ideal value not only using the first gate dielectric capping layer but also the workfunction-tuning properties of the barrier metal gate electrode layer 107 by choosing the appropriate material for the barrier metal gate electrode layer 107.

The foregoing description details certain embodiments of the invention. It will be appreciated, however, that no matter how detailed the foregoing appears in text, the invention may be practiced in many ways. It should be noted that the use of particular terminology when describing certain features or aspects of the invention should not be taken to imply that the terminology is being re-defined herein to be restricted to including any specific characteristics of the features or aspects of the invention with which that terminology is associated.

While the above detailed description has shown, described, and pointed out novel features of the invention as applied to various embodiments, it will be understood that various omissions, substitutions, and changes in the form and details of the device or process illustrated may be made by those skilled in the technology without departing from the spirit of the invention.

What is claimed is:

1. A dual workfunction semiconductor device comprising:
   a first transistor in a first region of a semiconductor substrate, the first transistor comprising a first gate stack having a first effective workfunction, wherein the first gate stack comprises a first gate dielectric capping layer over the semiconductor substrate in the first region, a gate dielectric host layer overlying the first gate dielectric capping layer, a first metal gate electrode layer overlying the gate dielectric host layer, a barrier metal gate electrode overlying the first metal gate electrode layer, a second gate dielectric capping layer overlying the barrier metal gate electrode, and a second metal gate electrode overlying the second gate dielectric capping layer; and
   a second transistor in a second region of the semiconductor substrate, the second transistor comprising a second gate stack having a second effective workfunction being different from the first effective workfunction, wherein the second gate stack comprises a gate dielectric host layer overlying the semiconductor substrate in the second region, a first metal gate electrode overlying the gate dielectric host layer, a second gate dielectric capping layer overlying the first metal gate electrode, and a second metal gate electrode overlying the second gate dielectric capping layer,
   wherein the second metal gate electrode layer from the first gate stack and the second metal gate electrode from the second gate stack are formed by the same metal composition as the first metal gate electrode layer from the first gate stack and the first metal gate electrode from the second gate stack.

2. The dual workfunction semiconductor device according to claim 1, wherein the first metal gate electrode layer, the barrier metal gate electrode layer and the first gate dielectric capping layer of the first gate stack are selected to tune the first effective workfunction of the first gate stack.

3. The dual workfunction semiconductor device according to claim 1, wherein the first metal gate electrode layer, the second gate electrode layer and the second gate dielectric capping layer of the second gate stack are selected to tune the second effective workfunction of the second gate stack.

4. The dual workfunction semiconductor device according to claim 1, wherein the barrier metal electrode layer comprises TiN or TaN.

5. The dual workfunction semiconductor device according to claim 1, wherein the first effective workfunction is larger than the second effective workfunction.

6. A dual workfunction semiconductor device according to claim 5, wherein
the first dielectric capping layer is selected from the group of AlO, AlN, AlON and mixtures thereof,
the second dielectric capping layer is selected from the group of DyO, LaO, GdO, ErO and mixtures thereof,
the first metal gate electrode layer and the second metal gate electrode layer comprise a material selected from a group of $Ta_xC_y$, with x and y real numbers $0<x,y<1$;
the barrier metal electrode layer comprises TiN.

7. A dual workfunction semiconductor device comprising:
a first gate dielectric capping layer over a semiconductor substrate in a first region of the substrate;
a gate dielectric host layer over the first gate dielectric capping layer in the first region and over the substrate in a second region of the substrate;
a first metal gate electrode layer over the gate dielectric host layer in the first and second region;
a barrier metal gate electrode layer overlying the first metal gate electrode layer in the first region;
a second gate dielectric capping layer over the first metal gate electrode layer in the first region and the first metal gate electrode layer in the second region; and
a second metal gate electrode layer over the second gate dielectric capping layer in the first region and in the second region,
wherein a first gate stack is formed in the first region, the first gate stack comprising the first gate dielectric capping layer, the gate dielectric host layer, the first metal gate electrode layer, the barrier metal gate electrode, the second gate dielectric capping layer, and the second metal gate electrode, and
wherein a second gate stack is formed in the second region, the second gate stack comprising the gate dielectric host layer, the first metal gate electrode, the second gate dielectric capping layer, and the second metal gate electrode.

8. The dual workfunction semiconductor device according to claim 7, wherein the first gate stack has first effective workfunction, and the second gate stack has a second effective workfunction different from the first effective workfunction.

9. The dual workfunction semiconductor device according to claim 7, wherein the second metal gate electrode layer is formed from the same metal composition as the first metal gate electrode layer.

* * * * *